(12) United States Patent
Moon

(10) Patent No.: US 6,483,861 B2
(45) Date of Patent: Nov. 19, 2002

(54) SILICON THIN FILM STRUCTURE FOR OPTOELECTRONIC DEVICES AND METHOD FOR FABRICATING THE SAME

(75) Inventor: Dae-Won Moon, Taejon (KR)

(73) Assignee: Korea Research Institute of Standards & Science, Taejon (KR)

( * ) Notice: Subject to any disclaimer, the term of this patent is extended or adjusted under 35 U.S.C. 154(b) by 0 days.

(21) Appl. No.: 09/860,382

(22) Filed: May 18, 2001

(65) Prior Publication Data

US 2002/0117673 A1 Aug. 29, 2002

(30) Foreign Application Priority Data

Feb. 26, 2001 (KR) .............................................. 01-9691

(51) Int. Cl.$^7$ ................................................ H01S 5/00
(52) U.S. Cl. .............................. 372/45; 372/49; 372/54
(58) Field of Search .......................... 257/79; 437/129; 252/301.4; 372/45, 49, 54

(56) References Cited

U.S. PATENT DOCUMENTS 3,855,144 A * 12/1974 Barber et al. ............. 252/301.4
5,607,876 A * 3/1997 Biegelsen et al. .......... 437/129

OTHER PUBLICATIONS

An article entitled Er–Carrier Interaction and its Effects on the Er3+ Luminescence of Erbium–Doped Si/SiO2 Superlattices, By Jung H. Shin et al., published Jun 12, 2000, in the American Institute of Physics, vol. 76, No. 24, pp. 3567–3569.

An article entitled "1.54 μm Er3+ Photoluminescent Properties of Erbium–Doped Si/SiO2 Superlattices", By Jung H. Shin et al., published Mar. 15, 1999, in the American Institute of Physics, vol. 74, No. 11, pp. 1573–1575.

An article entitled "1.54–μm Luminescene of Erbium–Implanted III–V Semiconductors and Silicon", By H. Ennen et al., published Nov. 15, 1983, in the American Institute of Physics vol. 43, No. 10, pp. 943–945.

An article entitled "Room–Temperature Photoluminescence and Electroluminescence from Er–Doped Silicon–Rich Silicon Oxide", By L. Tsybeskov et al., published Apr. 7, 1997, in the American Institute of Physics, vol. 70, No. 14, pp. 1790–1792.

An article "Room–Temperature Sharp Line Electroluminescence at λ = 1.54 μm from an Erbium–Doped Silicon Light–Emitting Diode", By B. Zheng et al., publishing May 23, 1994, in the American Institute of Physics vol. 64, Nov. 21, pp. 2842–2844.

An article entitled "Room–Temperature Electroluminescence from ER–Doped Crystalline Si", By G. Franzò et al., published Apr. 25, 1994 in the American Institute of Physics, vol. 64, No. 17, pp. 2235–2237.

* cited by examiner

Primary Examiner—Hoai Ho
Assistant Examiner—Tu-Tu Ho
(74) Attorney, Agent, or Firm—Bachman & LaPointe, P.C.

(57) ABSTRACT

Disclosed are a silicon thin film structure for optoelectronic devices and a method for manufacturing the same. The silicon thin film structure for optoelectronic devices, comprises a multi-layered structure consisting of a plurality of structural units, each comprising: a silicon base layer; and a luminescent, rare earth element-doped silica layer on said silicon base layer, or a multi-layered structure consisting of a plurality of structural units, each comprising: a silicon base layer; a lower undoped silica buffer layer for restraining the silicon layer from absorbing emitted light on said silicon base layer; a luminescent, rare earth element-doped silica layer for emitting light on said lower undoped silica buffer layer; and an upper, undoped silica buffer layer for restraining the silicon from absorbing emitted light on said luminescent, doped silica layer. Hence, while the multi-layered structures of silicon/silica are set as a basic backbone, the undoped silica layer is interposed between the silicon layer and the erbium-doped silica layer, thereby increasing the total luminescence efficiency. Additionally, the silica layer is so thin in the multi-layered structures that high electric conductivity can be attained.

7 Claims, 5 Drawing Sheets

FIGURES n times repetition growth

SILICON THIN FILM STRUCTURE FOR OPTOELECTRONIC DEVICES AND METHOD FOR FABRICATING THE SAME

BACKGROUND OF THE INVENTION

1. Field of the Invention

The present invention relates to a silicon thin film structure for optoelectronic devices employed in optical communication fields. More specifically, the present invention relates to a silicon thin film structure for optoelectronic devices comprising a silicon/silica superlattice structure as a basic backbone, which has excellent luminescence efficiency, by doping an erbium element in a silica layer, or interposing a pure silica layer between a silicon layer and an erbium-doped silica layer, or adjusting thickness of a silicon layer in the silicon and erbium-doped silica superlattices, and a method for manufacturing the same.

2. Description of the Prior Art

Generally, optoelectronic devices have been fabricated by use of semiconductors of Group III–V compounds. However, the integration process of the semiconductors into single chips is difficult because of definitely different chemical properties between Group III elements and Group V elements, as recognized from the fact that, since the first success in the development of silicon-based integrated electronic devices, various efforts have been made to substitute other Group III–V compounds having more excellent physical properties (faster in the mobility of electrons and holes on a silicon base) for the conventional ones, but failed to fabricate devices with faster response speed. However, as with electronic devices whose functions advanced rapidly after their integration, electronic devices will likely be successfully integrated in the very near future, thereby raising expectations of greater advances in this field.

Luminescence can be easily obtained from semiconductors of Group III–V compounds, but they are difficult to be integrated. By contrast, silicon can be integrated, but do not emit light owing to indirect band gap in the crystalline structure phase of silicon. There have been. devised various methods for emitting light from silicon. One of them is to dope luminescent materials to silicon. As the luminescent materials, rare-earth elements were suggested. Of them, erbium has been under vigorous study. The reason is that erbium emits light with a wavelength of 1.54 μm, which shows the lowest optical absorption rate in optical fibers in current use in the optical communication fields and consequently, has the advantage of being low in light loss. Already, light-emitting diodes using erbium-doped silicon have been fabricated, but not developed to practical use because of low luminescence efficiency. To circumvent this problem, erbium and nanocrystalline silicon are doped into silica, thus raising the luminescence efficiency. The doping of Er and Si nanostructures into silica experiences difficulty in controlling the number and size of nanostructures and the location of erbium. In order to emit light, erbium must receive energy from the nanocrystalline silicon and not transmit the energy back to the nm-thin silicon. In other words, to increase erbium luminescence, erbium and silicon should be present at such locations relative to each other as not to back-transmit energy transmitted from the nanocrystalline silicon. But, it is highly difficult to control the location of erbium and silicon. Moreover High electric conductivity is required for performing electric excitation in electroluminescence device. However, the silica film as thick as 1 micron or more, even though containing nanocrystalline silicon therein, suffers from the disadvantage of being very poor in electric conductivity.

SUMMARY OF THE INVENTION

Accordingly, an object of the present invention for alleviating the problems as described above is to provide a silicon thin film structure for optoelectronic devices, which have increased luminescence efficiency and high conductivity, and a method for manufacturing the same.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
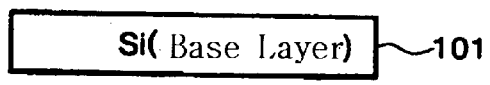
FIGS. 1a to 1d are views showing preparation procedures of a silicon thin film structure for optoelectronic devices according to a manufacturing method thereof in a first embodiment of the present invention.

To achieve said object, there is provided a silicon thin film structure for optoelectronic devices according to a first embodiment of the present invention, comprising a multi-layered structure consisting of a plurality of structural units, each comprising:

a silicon base layer; and a luminescent, rare earth element-doped silica layer formed on said silicon base layer.

In addition, there is provided a silicon thin film structure for optoelectronic devices according to a second embodiment of the present invention, comprising a multi-layered structure consisting of a plurality of structural units, each comprising:

a silicon base layer;

a lower undoped silica buffer layer for restraining the silicon layer from the absorption of emitted light, formed on said silicon base layer;

a luminescent, rare earth element-doped silica layer for emitting light, formed on said lower undoped silica buffer layer; and an upper, undoped silica buffer layer for restraining the silicon from the absorption of emitted light, formed on said luminescent, doped silica layer.

Further, there is provided a method for fabricating a silicon thin film structure for optoelectronic devices according to the first embodiment of the present invention, comprising:

(a) forming a silicon base layer;

(b) laminating a luminescent, rare earth element-doped silica layer for emitting light on said silicon base layer; and (c) successively repeating said steps of (a) and (b) a plural number of times.

The method further comprises the step of depositing a silicon cap layer for protecting sub-structures, atop the uppermost, undoped silica buffer layer, after said step (c).

Furthermore, there is provided a method for fabricating a silicon thin film structure for optoelectronic devices according to the second embodiment of the present invention, comprising:

a) forming a silicon base layer;
b) laminating a lower undoped silica buffer layer for restraining the silicon from adsorbing emitted light, on said silicon base layer;
c) superposing a luminescent, rare earth element-doped silica layer for emitting light, on said undoped silica buffer layer;
d) laminating an upper undoped silica buffer layer for restraining the silicon from absorbing emitted light, on said luminescent, doped silica layer; and
e) successively repeating said steps of (a) to (d) a plural number of times.

The method further comprises the step of depositing a silicon cap layer for protecting sub-structures, atop the uppermost, undoped silica buffer layer, after said step (e).

In accordance with the present invention, while multilayered structures of alternately laminated silicon thin film layer and an erbium-doped silica layer are set as a basic backbone, an undoped pure silica layer is interposed into the silicon layer and the erbium-doped silica layer so as to restrain the silicon layer from the absorption of emitted light, thus increasing the whole luminescence efficiency. Additionally, multi-layered structures of silicon/silica are advantageous in terms of ease of conductivity attributed to thin silica layer.

Turning now to the drawings in greater detail, there is shown in FIGS. 1a to 1d a preparation procedure of a silicon thin film structure for optoelectronic devices by use of a manufacturing method thereof according to a first embodiment of the present invention.

Figure 1B:
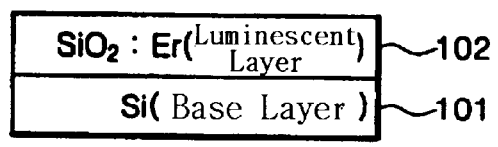

As can be seen in FIG. 1a, a silicon (Si) base layer 101 is primarily formed. Then, a luminescent, certain rare earth element-doped silica (SiO$_2$) layer 102 for emitting light is laminated on the silicon base layer 101, as seen in FIG. 1b. As such, examples of the rare earth elements to be doped include praseodymium (Pr, atomic number: 59), neodymium (Nd, atomic number: 60), erbium (Er, atomic number: 68) and so on. Among them, it is preferred that erbium is used. Erbium has luminescent wavelength of 1.54 $\mu$m, so its optical absorption rate in optical fiber used in optical communication fields is the lowest, thus light loss being low.

Figure 1C:
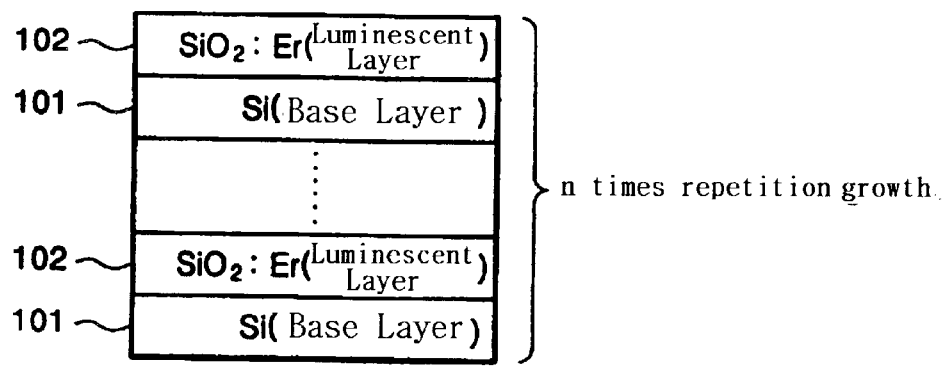

After the luminescent erbium-doped silica layer 102 is formed, a set of said silicon base layer 101 and luminescent erbium-doped silica layer 102 is consecutively laminated a plural number of times (n times: tens of times), as illustrated in FIG. 1c. In order to form each layer as mentioned above, a UHV (ultra-high vacuum) ion beam sputtering or a PECVD (plasma enhanced chemical vapor deposition) may be used. The silicon base layer 101 and the luminescent erbium-doped silica layer 102 are deposited under pressures of 8×10$^{-5}$ Torr and 1×10$^{-4}$ Torr, respectively. The luminescent erbium-doped silica layer 102 is preferably 3–10 nm thick, and the silicon base layer 101 is preferably 0.6–3.6 nm thick. More preferably, the silicon layer thickness is a monolayer. To achieve a monolayer thickness of silicon, the growth rate is slow as such as 0.014 nm/sec or slower.

Meanwhile, the silicon base layer 101 and the luminescent, erbium-doped silica layer 102 are alternately laminated tens of times, thereby completing the manufacturing method according to the first embodiment of the present invention. This is because the object of the present invention can be achieved by thusly formed silicon thin film structures.

Figure 1D:
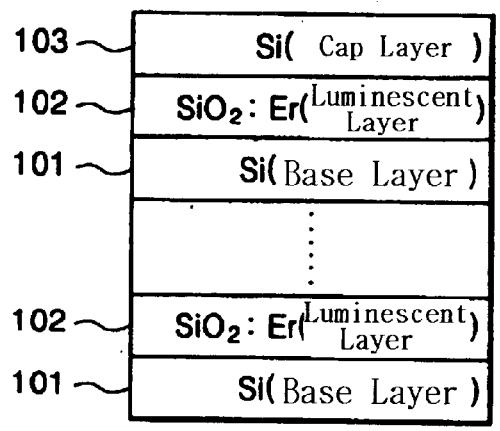

However, it is preferred that, after the silicon base layer 101 and the luminescent erbium-doped silica layer 102 are alternately laminated tens of times, a silicon cap layer w 103 is deposited atop the uppermost, luminescent silica layer 102 so as to protect the laminated sub-structures, as best seen in FIG. 1d. In order to prevent the thin film structure from cracking or being broken, the deposited silicon cap layer 103 is annealed in a sequence of 20 minutes at 600° C., and 5 minutes at 950° C., and 5 minutes at 600° C. under a flowing argon (Ar) atmosphere. Thereby, an entire silicon thin film structure is completed according to the first embodiment of the present invention.

FIGS. 2a to 2e show a preparation procedure of a silicon thin film structure for optoelectronic devices by use of a manufacturing method thereof according to a second embodiment of the present invention.

Figure 2A:
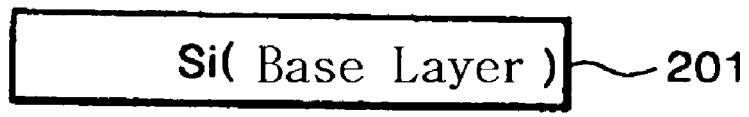
FIGS. 2a to 2e are views showing preparation procedures of a silicon thin film structure for optoelectronic devices according to a manufacturing method thereof in a second embodiment of the present invention.
Figure 2B:
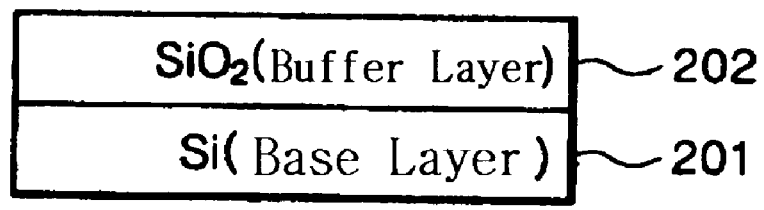
Figure 2C:
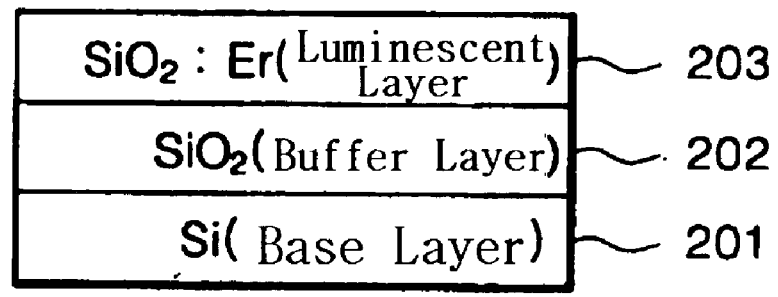
Figure 2D:
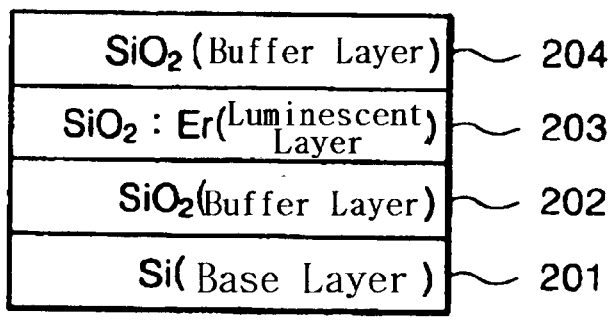
Figure 2E:
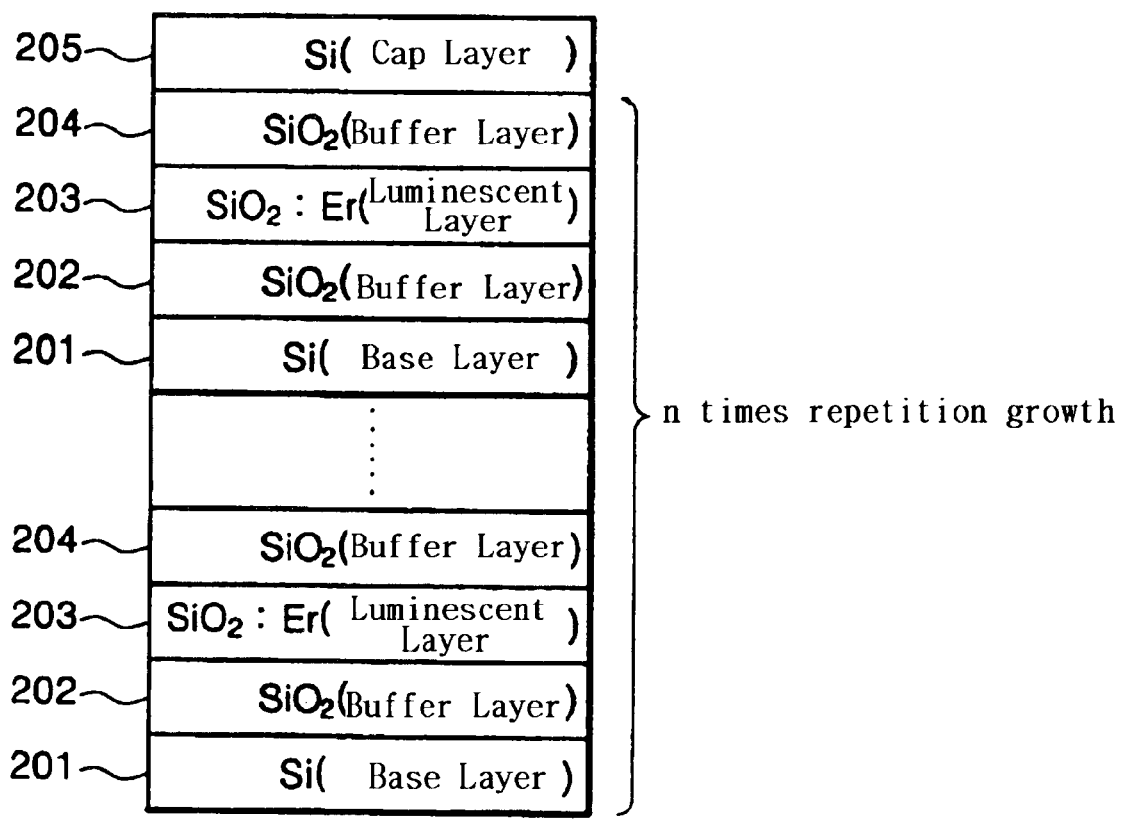

As illustrated in FIG. 2a, a silicon (Si) base layer 201 is formed. Next, as seen in FIG. 2b, a lower undoped silica buffer layer 202 for restraining the silicon layer from the absorption of emitted light is laminated on the silicon base layer 201. In FIG. 2c, a luminescent silica layer 203 in which a certain rare earth element for emitting light, for example, erbium, is doped, is superposed on the lower undoped silica buffer layer 202. As can be seen in FIG. 2d, on the luminescent, doped silica layer 203, an upper undoped silica buffer layer 204 is laminated so as to restrain the silicon layer from absorbing emitted light. Thereafter, lamination procedures of said silicon base layer 201 to the upper buffer layer 204 are successively repeated tens of times, as illustrated in FIG. 2e. As such, a UHV ion beam sputtering or a PECVD can be used to deposit each of said layers, like the first embodiment. The silicon base layer 201 and the luminescent erbium-doped silica layer 203 are deposited under pressures of 8×10$^{-5}$ Torr and 1×10$^{-4}$ Torr, respectively. The luminescent erbium-doped silica layer 203 is preferably 3–10 nm thick, and the silicon base layer 201 is preferably 0.6–3.6 nm thick. More preferably, the silicon layer thickness is a monolayer.

The lamination procedure of said silicon base layer 201 to said upper buffer layer 204 are consecutively repeated tens of times, thereby completing the manufacturing method according to the second embodiment of the present invention. This is because the object of the present invention can be achieved by thusly formed silicon thin film structures, like said first embodiment.

However, it is preferred that, after the silicon base layer 201 is laminated to the upper undoped silica buffer layer 204 in order tens of times, a silicon cap layer 205 is deposited atop the uppermost, undoped silica buffer layer 204 so as to protect the sub-structures. Preferably, like the first embodiment, the deposited silicon cap layer 205 is annealed in a sequence of 20 minutes at 600° C., and 5 minutes at 950° C., and 5 minutes at 600° C. under a flowing Ar atmosphere to prevent the thin film structure from cracking or being broken. Thereby, an entire silicon thin film structure is completed according to the second embodiment of the present invention.

As stated above, the silicon thin film structure (see, FIG. 2e) according to the second embodiment of the present invention has each of undoped pure silica buffer layers 202 and 204 interposed between the silicon base layer 201 and the luminescent erbium-doped silica layer 203, and the luminescent silica layer and the silicon cap layer 205, different from the silicon thin film structure according to the first embodiment of the present invention (see, FIG. 1d). Hence, the silicon thin film structure according to the second embodiment prevents light emitted from the luminescent layer 203 to be absorbed in the silicon layer, thus having superior luminescence efficiency to that of the structure of the first embodiment.

Figure 3:
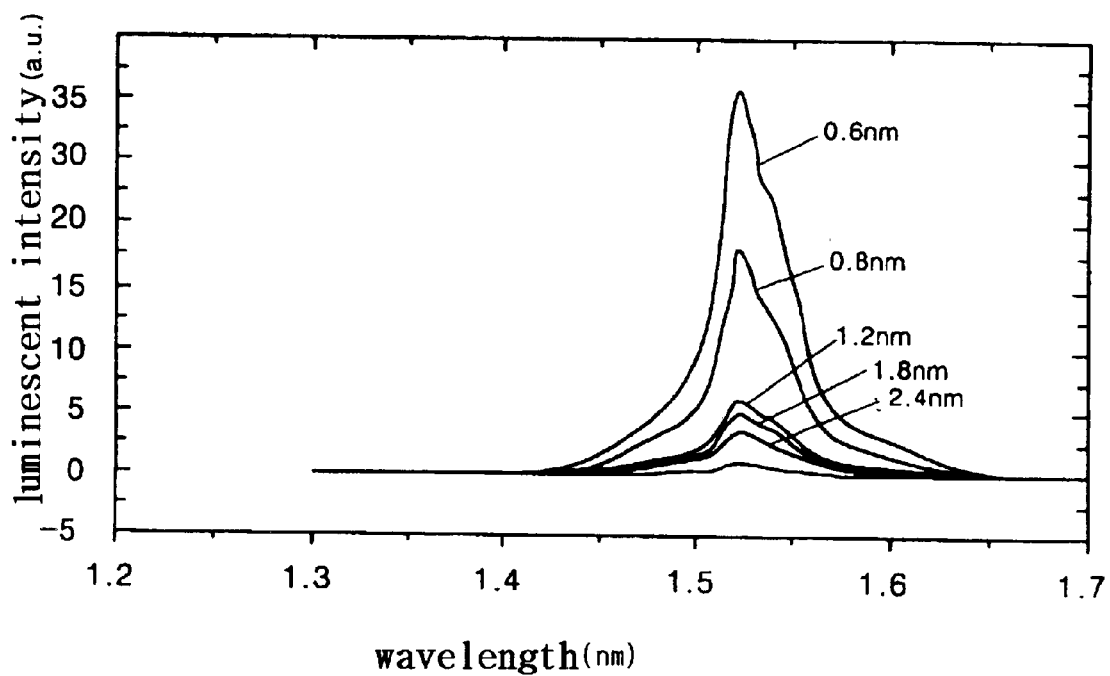
FIG. 3 is a graph showing luminescence intensity versus wavelength, in a silicon thin film structure for optoelectronic devices of the present invention.
Figure 4:
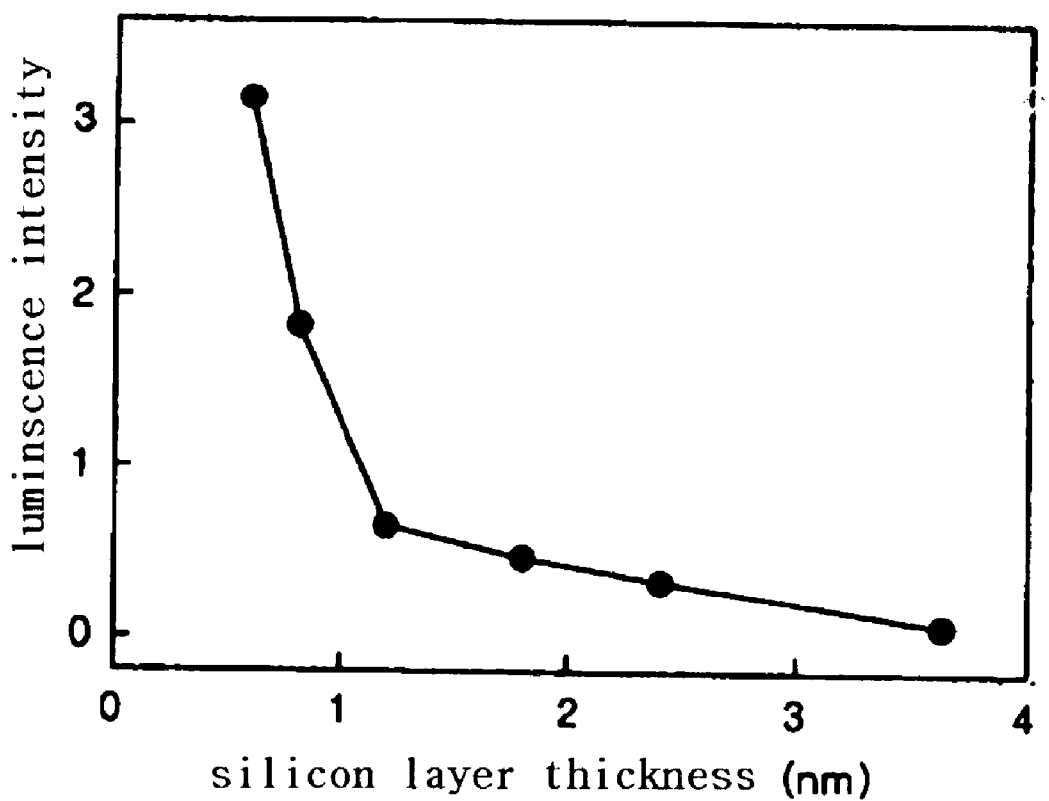
FIG. 4 is a graph showing integrated luminescence intensity versus thickness of silicon layer of FIG. 3, in a silicon thin film structure for optoelectronic devices of the present invention.

FIGS. 3 and 4 show luminescence properties of the silicon thin film structures for optoelectronic devices according to the present invention, in which FIG. 3 is a graph showing luminescence intensity according to wavelength, and FIG. 4 is a graph showing integrated luminescence intensity according to thickness of the silicon layer.

The photoluminescent properties of the silicon thin film structures for optoelectronic devices according to the present invention are measured using an Ar laser, a grating monochromator, a thermoelectrically cooled InGaAs detector, and the standard lock-in technique. In addition, a TEM (transmission electron microscopy) and a MEIS (medium energy ion scattering spectroscopy) are used to analyze the deposited films.

Referring to FIG. 3, in the silicon thin film structures for optoelectronic devices according to the present invention, the luminescence intensity of erbium ions ($Er^{3+}$) doped in the luminescent silica layer has various peak values depending on different thickness of the silicon layers 101 and 201 (0.6 nm, 0.8 nm, 1.2 nm, 1.8 nm, 2.4 nm, 3.6 nm) in each sample having various thickness of the silicon layers 101 and 201. However, as can be seen in said graph, the luminescence intensity is the strongest at the wavelength of approximately 1.54 $\mu$m, in each sample having different thickness of the silicon layer. Considering that optical absorption rate in optical fiber is the lowest at the wavelength of 1.54 $\mu$m, it can be found that, when employed in optical communication fields related to optical fibers, the silicon thin film structures of the present invention have excellent luminescence efficiency.

As illustrated in FIG. 4, in the sample of the silicon thin film structures according to the present invention, when the thickness of the silicon layers 101 and 201 is varied while uniformly maintaining the thickness of the silica luminescence layers 102 and 203, the luminescence intensity is in inverse proportion to the thickness of the silicon layers 101 and 201. That is, the thicker the silicon layers 101 and 201, the weaker the intensity. From this, it can be seen that the silicon layers 101 and 201 are preferably formed as thin as possible on the preparation of the silicon thin film structures of the present invention.

Therefore, while multi-layered structures of alternately laminated silicon thin film layer and the erbium-doped silica layer are set as the basic backbone in the silicon thin film structures for optoelectronic devices of the present invention, the undoped pure silica layer is interposed between the silicon layer and the erbium-doped silica layer in order to restrain the silicon layer from the absorption of emitted light, thereby increasing the total luminescence efficiency. In such multi-layered structures of the silicon/silica, the silica layer is so thin that high electrical conductivity can be obtained. So, when employed in the optical communication fields, the structures of the present invention can increase stability of signaling and communication efficiency.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A silicon thin film structure for optoelectronic devices, comprising a multi-layered structure consisting of a plurality of structural units, each comprising:
   a silicon base layer;
   a lower undoped silica buffer layer for restraining the silicon layer from the absorption of emitted light, formed on said silicon base layer;
   a luminescent, rare earth element-doped silica layer for emitting light, formed on said lower undoped silica buffer layer; and
   an upper, undoped silica buffer layer for restraining the silicon layer from the absorption of emitted light, formed on said luminescent, doped silica layer.

2. The silicon thin film structure as defined in claim 1, further comprising a silicon cap layer for protecting sub-structures, atop the uppermost, undoped silica layer of the multi-layered structure consisting of said structural units.

3. The silicon thin film structure as defined in claim 1, wherein said rare earth element is erbium.

4. A method for fabricating a silicon thin film structure for optoelectronic devices, comprising the steps of:
   a) forming a silicon base layer;
   b) laminating a lower undoped silica buffer layer for restraining the silicon from absorbing emitted light, on said silicon base layer;
   c) superposing a luminescent, rare earth element-doped silica layer for emitting light, on said undoped silica buffer layer;
   d) laminating an upper undoped silica buffer layer for restraining the silicon from absorbing emitted light, on said luminescent, doped silica layer; and
   e) successively repeating said steps of (a) to (d) a plural number of times.

5. The method as defined in claim 4, further comprising the step of depositing a silicon cap layer for protecting sub-structures, atop the uppermost, undoped silica buffer layer, after said step (e).

6. The method as defined in claim 5, further comprising the step of annealing the thin film structure to prevent the structure from cracking or being broken, after the depositing step.

7. The method as defined in claim 6, wherein the annealing step is carried out in a sequence of 20 minutes at 600° C., and 5 minutes at 950° C., and 5 minutes at 600° C. under a flowing Ar atmosphere.

* * * * *